(12) United States Patent
van Baarsen et al.

(10) Patent No.: US 7,196,642 B2
(45) Date of Patent: Mar. 27, 2007

(54) CIRCUITRY AND METHOD FOR SAMPLING AUDIO DATA

(75) Inventors: John Peter van Baarsen, Delta (CA); Jiliang Song, Surrey (CA)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/210,404

(22) Filed: Aug. 24, 2005

(65) Prior Publication Data

US 2007/0046503 A1  Mar. 1, 2007

(51) Int. Cl.
*H03M 7/00* (2006.01)

(52) U.S. Cl. .......................... 341/61; 708/313
(58) Field of Classification Search ................. 341/61; 708/313
See application file for complete search history.

(56) References Cited

U.S. PATENT DOCUMENTS

| | | | |
|---|---|---|---|
| 5,274,372 A | 12/1993 | Luthra et al. | |
| 5,907,295 A * | 5/1999 | Lin .............................. | 341/61 |
| 5,987,145 A | 11/1999 | Lawton | |
| 6,041,339 A * | 3/2000 | Yu et al. ....................... | 708/313 |
| 6,201,486 B1 * | 3/2001 | Chan et al. .................... | 341/61 |
| 6,411,225 B1 | 6/2002 | Van Den Enden et al. | |
| 6,531,969 B2 | 3/2003 | Chu | |
| 6,834,292 B2 | 12/2004 | Jiang et al. | |
| 2002/0133524 A1 | 9/2002 | Schmidt | |
| 2003/0161486 A1 | 8/2003 | Wu et al. | |
| 2005/0168360 A1 * | 8/2005 | Chen ........................... | 341/61 |

FOREIGN PATENT DOCUMENTS

| | | |
|---|---|---|
| JP | 10-285124 | 10/1998 |
| JP | 2004-274624 | 9/2004 |

* cited by examiner

*Primary Examiner*—Howard L Williams
(74) *Attorney, Agent, or Firm*—Mark P. Watson

(57) ABSTRACT

A method for sampling audio data is provided. In this method, the audio data is received and sampled at a first sampling rate using a first interpolation calculation. Thereafter, the audio data sampled at the first sampling rate is again sampled at a second sampling rate using a second interpolation calculation. After sampling, the second audio data sampled at the second sampling rate is outputted. Circuitries and systems for sampling audio data also are described.

14 Claims, 5 Drawing Sheets

CIRCUITRY AND METHOD FOR SAMPLING AUDIO DATA

BACKGROUND

Audio data can be sampled at a variety of different bit rates. The sampling rate defines a number of samples per second taken from a continuous signal to make a discrete signal. One approach is to sample the audio data by using linear interpolation. Linear interpolation is a simple and fast form of interpolation, but the quality of the sampled audio can be poor if the difference between the sampling rates of the original audio data and the outputted data is large. For example, if the audio data is originally sampled at 16 KHz and a computing device is configured to sample and to output the audio data at 44.1 KHz, using linear interpolation to sample the 16 KHz audio data to 44.1 KHz would introduce a large amount of aliased signals at higher frequencies and therefore, would result in a poor quality output. Another approach is to sample the data using a more complicated band-limited interpolation. Band-limited interpolation yields good interpolation performance, but the complex calculations associated with band-limited interpolation are time consuming when compared to linear interpolation and requires a large logic circuit.

In view of the foregoing, there is a need for methods and circuitries that could quickly sample audio data and have a small hardware footprint.

SUMMARY

Broadly speaking, the present invention fills these needs by providing devices, methods, and systems for sampling audio data. It should be appreciated that the present invention can be implemented in numerous ways, including as a method, a system, or a device. Several inventive embodiments of the present invention are described below.

In accordance with a first aspect of the present invention, a method for sampling audio data is provided. In this method, the audio data is received and sampled at a first sampling rate using a first interpolation calculation. Thereafter, the audio data sampled at the first sampling rate is again sampled at a second sampling rate using a second interpolation calculation. After sampling, the audio data sampled at the second sampling rate is outputted.

In accordance with a second aspect of the present invention, a method for sampling audio data is provided. First, the audio data is received and the received audio data has a sampling rate that is less than 48 kilohertz. The audio data is then sampled at 48 kilohertz. Thereafter, the audio data sampled at 48 kilohertz is again sampled at 44.1 kilohertz. After sampling at 44.1 KHz, the audio data is outputted.

In accordance with a third aspect of the present invention, a system for sampling audio data is provided. The system includes an audio decoder and a resampling circuit in communication with the audio decoder. The resampling circuit includes circuitry configured for sampling the audio data at 48 kilohertz and at 44.1 kilohertz. The system additionally includes a digital-to-analog converter in communication with the resampling circuit.

In accordance with a fourth aspect of the present invention, a resampling circuit for sampling audio data is provided. The resampling circuit includes a multiplier accumulator configured to sample the audio data at 48 kilohertz and at 44.1 kilohertz. Additionally, the resampling circuit includes a memory in communication with the multiplier communicator and a selection circuitry in communication with the memory and the multiplier accumulator. The selection circuitry is configured to select the audio data sampled at 44.1 KHz for output to a digital-to-analog converter.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

An invention is described for methods and circuitries for sampling audio data. It will be obvious, however, to one skilled in the art, that the present invention may be practiced without some or all of these specific details. In other instances, well known process operations have not been described in detail in order not to unnecessarily obscure the present invention.

The embodiments described herein provide methods, systems, and circuitries for sampling audio data. Essentially, embodiments of the invention combines two different sampling methods to sample audio data. Initially, the audio data is categorized into one of two groups. If the audio data is categorized in a first group, the audio data can be easily and directly sampled at an output sampling rate. If the audio data is categorized in a second group, as will be explained in more detail below, the audio data is sampled in two stages using two different sampling methods. In one embodiment for the second group, the first sampling method up samples the audio data to a first value in the first stage, and then down samples the audio data to a second value in the second stage.

Figure 1:
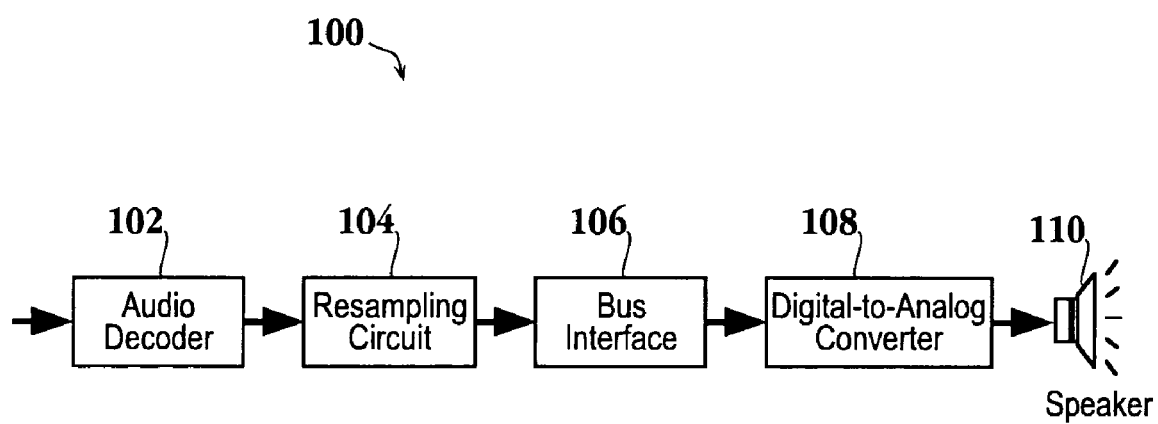
FIG. 1 is a simplified block diagram of a high level overview of a system for sampling audio data, in accordance with one embodiment of the present invention.

FIG. 1 is a simplified block diagram of a high level overview of a system for sampling audio data, in accordance with one embodiment of the present invention. As shown in FIG. 1, system 100 includes audio decoder 102, resampling circuit 104, bus interface 106, digital-to-analog converter 108, and speaker 110. Audio decoder 102 is any suitable device that decodes encoded audio data such that the original audio data can be retrieved. An exemplary audio decoder 102 is an MPEG-1 Audio Layer 3 (MP3) decoder. It should be appreciated that MP3 is a lossy compression format that provides a representation of pulse-code modulation-encoded (PCM) audio data in a small size by discarding portions of the audio data that are considered less important to human hearing. MP3 audio can be sampled (i.e., compressed) with different bit rates, such as 16 kilohertz (KHz), 22.05 KHz, 24 KHz, 32 KHz, 44.1 KHz, 48 KHz, etc. Other exemplary audio decoders include an MPEG-1 Audio Layer 1 (MP1) decoder, an MPEG-1 Audio Layer 2 (MP2) decoder, etc.

Digital-to-analog converter 108 can be any suitable device for converting a digital code to an analog signal. A master clock sent by bus interface 106 can be 256 times the sampling rate for a digital-to-analog converter 108 with 16-bits accuracy. In one embodiment, digital-to-analog converter 108 utilizes a low pass filter with different cut-off frequencies according to the sampling rate. To simplify the master clock generation and low pass filter design, resampling circuit 104 is inserted between audio decoder 102 and digital-to-analog converter 108. As will be explained in more detail below, in one embodiment, resampling circuit 104 includes circuitry for sampling the audio data at 48 KHz and at 44.1 KHz. Essentially, resampling circuit 104 receives audio data from audio decoder 102, samples the audio data first at 48 KHz and then at 44.1 KHz, and then outputs the audio data sampled at 44.1 KHz to digital-to-analog converter 108 via bus interface 106.

Bus interface 106 can be any suitable interface that interfaces resampling circuit 104 to digital-to-analog converter 108. An exemplary bus interface 106 is the Inter-IC Sound (I²S) bus interface, which is a bus interface used for connecting digital audio devices together. The I²S bus interface can be used to carry audio data between resampling circuit 104 and digital-to-analog converter 108. The I²S bus interface separates clock and data signals. Accordingly, the I²S bus interface includes a clock line, a word select line, and a multiplexed data line.

Figure 2:
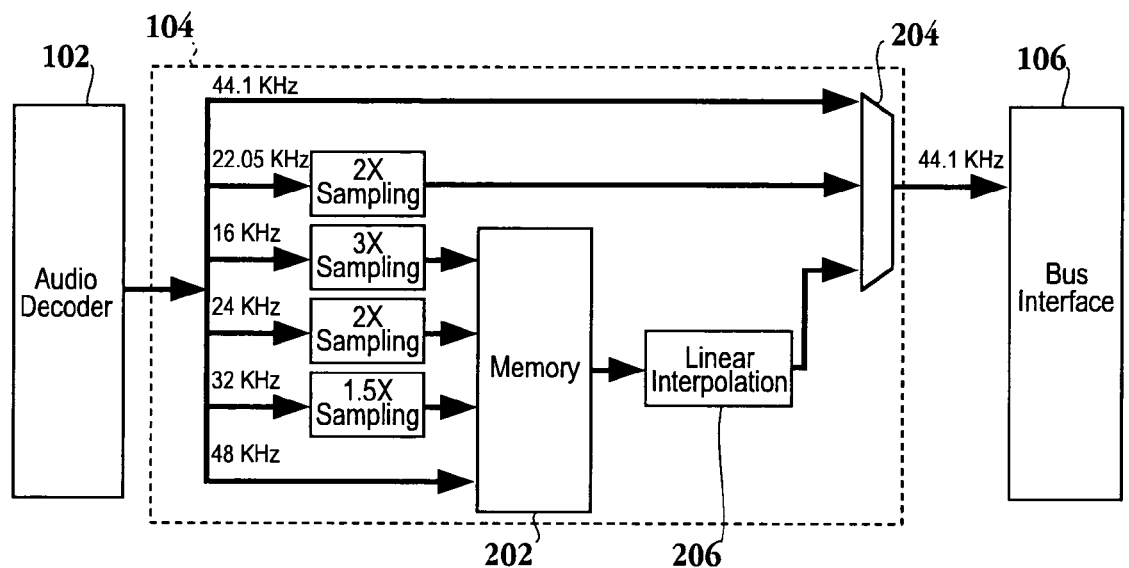
FIG. 2 is a detailed data path diagram of the resampling circuit shown in FIG. 1, in accordance with one embodiment of the present invention.

FIG. 2 is a detailed data path diagram of the resampling circuit shown in FIG. 1, in accordance with one embodiment of the present invention. Resampling circuit 104 receives audio data from audio decoder 102. As shown in FIG. 2, the audio data received by resampling circuit 104 can be sampled at different bit rates, such as 44.1 KHz, 22.05 KHz, 16 KHz, 24 KHz, 32 KHz, or 48 KHz. The sample rate information may be embedded in a header of the audio data. In the embodiment of FIG. 2, the audio data is sampled at less than or equal to 48 kilohertz. Circuitry within resampling circuit 104 reads the sampling rate information embedded in the audio data and, if the sampling rate is 44.1 KHz, then the resampling circuit directly outputs the audio data to bus interface 106. On the other hand, if the sampling rate is an integer multiple of 44.1 KHz, then the audio data is directly sampled at 44.1 KHz. In other words, the audio data is sampled at 44.1 KHz if the sampling rate of 44.1 KHz divided by the sampling rate of the audio data is an integer. As shown in FIG. 2, in one embodiment, an audio data sampled at 22.05 KHz is an integer multiple of 44.1 KHz because 44.1 KHz/22.05 KHz equals two (an integer). As a result, the 22.05 KHz is directly sampled to 44.1 KHz. In one embodiment, the audio data sampled as 22.05 KHz is up sampled through linear interpolation 206. It should be appreciated that any suitable sampling calculation can be used to sample the audio data to 44.1 KHz. For example, as will be explained in more detail below, the sampling of audio data at 44.1 KHz may be calculated through linear interpolation 206, in one embodiment.

If the audio data has a sampling rate that is not an integer multiple of 44.1 KHz (e.g., 16 KHz, 24 KHz, 32 KHz, and 48 KHz) or if the ratio of a 48 KHz sampling rate to a sampling rate of input audio data is 3:1, 2:1, or 3:2, then resampling circuit 104 uses a two-stage resampling method to sample the audio data. In the first stage, the audio data from audio decoder 102 is sampled at 48 KHz. Any suitable sampling calculation can be used. For instance, in one embodiment, the sampling to 48 KHz can be calculated by band-limited interpolation (i.e., polyphase filtering). As will be explained in more detail below, in one embodiment, a multiplier accumulator and a filter coefficient table can be used to implement band-limited interpolation. It should be appreciated that if the sampling rate of audio data received from audio decoder 102 is 48 KHz, the audio data is not sampled at 48 KHz and is instead directly sent to memory 202 for temporary storage.

After the audio data is sampled at 48 KHz, the audio data is temporarily stored in memory 202. Memory 202 functions as a buffer between first stage sampling to 48 KHz and second stage sampling to 44.1 KHz. In the second stage, the audio data sampled at 48 KHz is sampled at 44.1 KHz. Any suitable sampling calculation can be used to sample the audio data at 44.1 KHz. For example, in one embodiment, the sampling to 44.1 KHz can be calculated by linear interpolation 206. The calculations for linear interpolation 206 are simple and fast, and because the difference between 44.1 KHz and 48 KHz is small, the use of the linear interpolation to sample the audio data at 44.1 KHz would not result in the loss of too much audio quality. Additionally, linear interpolation 206 has good performance (about 70 decibel (dB) stopband attenuation and down less than 3 dB at 7.75 KHz). As will be explained in more detail below, in one embodiment, the logic circuitry to implement linear interpolation 206 can be shared with the multiplier accumulator associated with the first stage sampling at 48 KHz. Accordingly, linear interpolation 206 would not require extra logic circuitry in resampling circuit 104, thereby reducing the footprint for logic, which is beneficial for portable electronic devices.

After audio data is sampled at 44.1 KHz, selection circuitry 204 selects the appropriate audio data sampled at 44.1 KHz for output to bus interface 106. One skilled in the art will appreciate that selection circuitry 204 can be a 3:1 multiplexer. In one embodiment, the output selection depends on a select signal from audio decoder 102. As shown in FIG. 2, if the audio data from audio decoder 102 is originally sampled at 44.1 KHz, then the audio decoder sends a select signal to selection circuitry 204 to output the audio data directly from the audio decoder. If the audio data from audio decoder 102 is sampled at an integer multiple of 44.1 KHz (e.g., 22.05), then the audio decoder sends a select signal to selection circuitry 204 to output audio data that has been sampled to 44.1 KHz. Otherwise, audio decoder 102 sends a select signal to selection circuitry 204 to output the audio data that has been sampled at 48 KHz and at 44.1 KHz.

Figure 3:
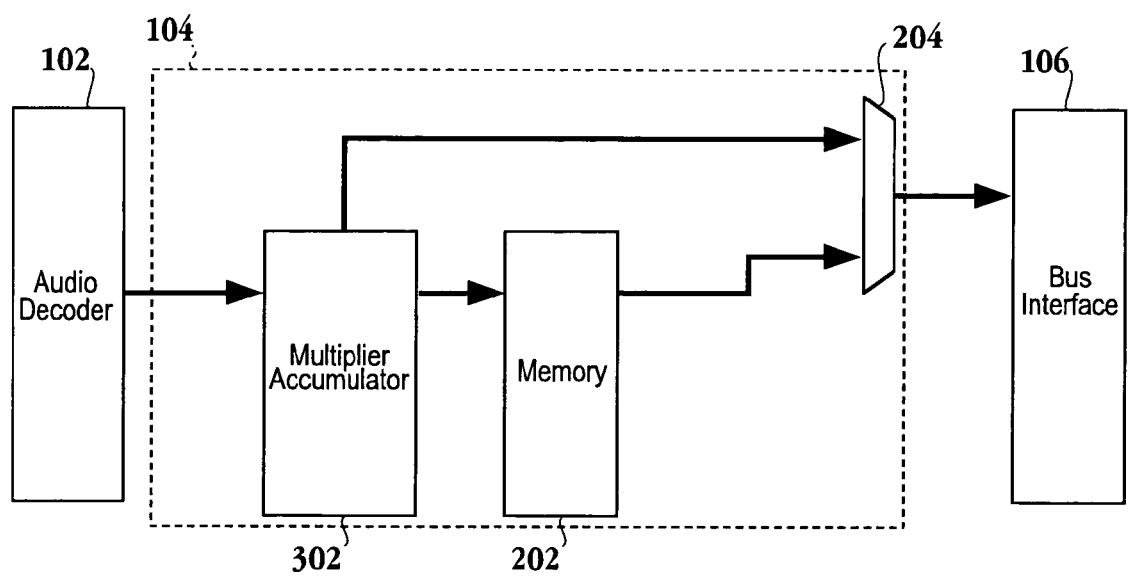
FIG. 3 is a simplified schematic diagram of the resampling circuit shown in FIG. 1, in accordance with one embodiment of the present invention.

FIG. 3 is a simplified schematic diagram of the resampling circuit shown in FIG. 1, in accordance with one embodiment of the present invention. As shown in FIG. 3, resampling circuit 104 includes multiplier accumulator 302, memory 202, and selection circuitry 204. Multiplier accumulator (MAC) 302 can be configured to sample the audio data at 48 KHz and at 44.1 KHz. Memory 202, as discussed above, functions as a buffer between the first stage sampling at 48 KHz and the second stage sampling at 44.1 KHz. Selection circuitry 204 is configured for selecting the appropriate audio data for output to bus interface 106. It should be appreciated that audio decoder 102 sends audio data to multiplier accumulator 302. Depending on the sampling rate of the audio data, multiplier accumulator 302 sends the audio data directly to a digital-to-analog converter through bus interface 106, samples the audio data at 44.1 KHz, or up samples the audio data first at 48 KHz and then down samples the data at 48 KHz to 44.1 KHz.

Figure 4:
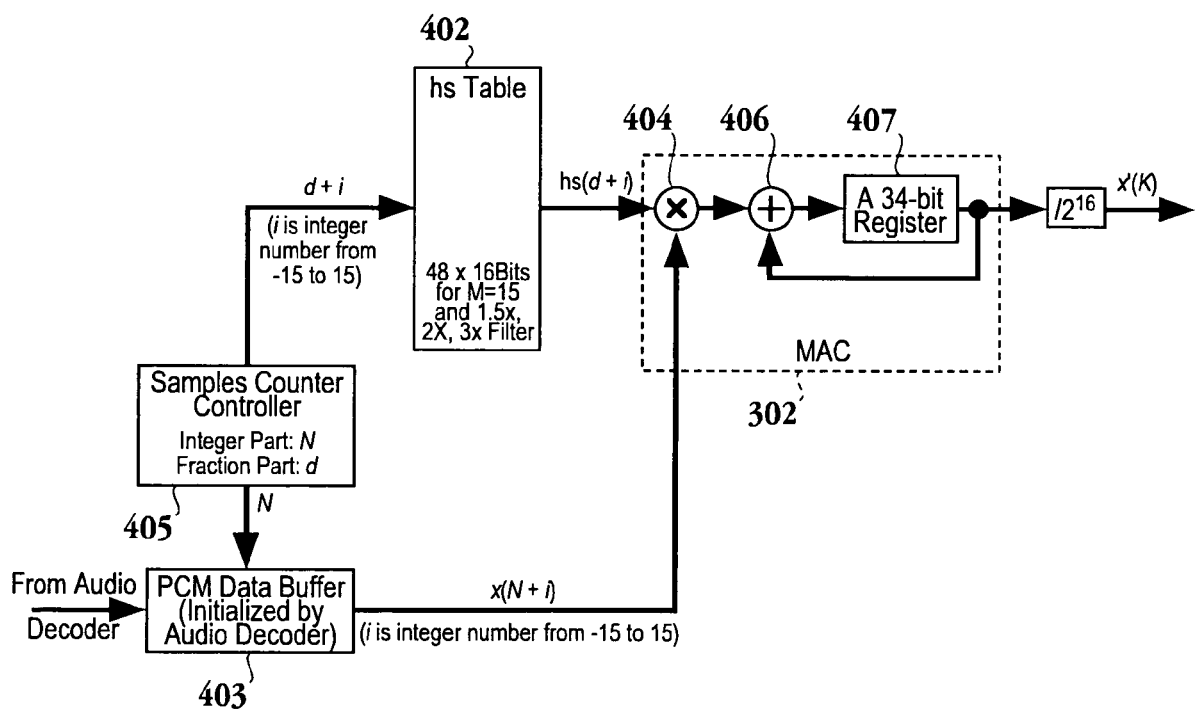
FIG. 4 is a more detailed schematic diagram of the multiplier accumulator (MAC) shown in FIG. 3, in accordance with one embodiment of the present invention.

FIG. 4 is a more detailed schematic diagram of the multiplier accumulator (MAC) shown in FIG. 3, in accordance with one embodiment of the present invention. As shown in FIG. 4, multiplier accumulator 302 includes filter coefficient table 402, multiplier 404, and adder 406. As discussed above, in one embodiment, multiplier accumulator 302 can be configured to sample audio data at 48 KHz by band-limited interpolation. Concerning band-limited interpolation, it should be appreciated that samples of $x(nT_s)$ of a continuous absolutely integrable signal x(t) are provided. The t is time in seconds, n ranges over the integers, and $T_s$ is the sampling period. An assumption is made that x(t) is band-limited to $F_s/2$, where $F_s=1/T_s$ is the sampling rate. If X(w) denotes the Fourier transform of x(t), in other words, $$X(\omega) = \int_{-\infty}^{\infty} x(t)e^{-j\omega t} dt, \qquad (1.1)$$

then we assume X(w)=0 for $$|\omega| \geq \pi F_s \qquad (1.3)$$

Consequently, Shannon's sampling theorem provides that x(t) can be uniquely reconstructed from the samples $x(nT_s)$ via $$x(t) \triangleq \sum_{n=-\infty}^{\infty} x(nT_s)h_s(t - nT_s) \equiv x(t), \qquad (1.5)$$

$$h_s(t) \triangleq \mathrm{sinc}(F_s t) \triangleq \frac{\sin(\pi F_s t)}{\pi F_s t} \qquad (1.7)$$

To resample x(t) at a new sampling rate $F_s'=1/T_s'$, Equation 1.7 is evaluated at integer multiples of $T_s'$. Therefore, the Kth new sample is $x'(K)=x(KT_s')$:

$$x(KT_s') \equiv \sum_{n=-\infty}^{\infty} x(nTs)hs(KTs' - nTs) = \qquad (1.9)$$

$$\sum_{n=-\infty}^{\infty} x(nTs)hs(d + NTs - nTs),$$

where $KT_s'=d+NT_s$, $d<T_s$. As such, Equation 1.9 can be used to calculate $x(KT_s')$. If 2M+1 samples are used to calculate the new $K_{th}$ sample (e.g., if M=2), then the new $K_{th}$ sample value:

$$x'(K)=x(N-2)*hs(d-2)+x(N-1)*hs(d-1)$$

$$+x(N)*hs(d)+x(N+1)*hs(d+1)+x(N+2)*hs(d+2) \qquad (2.0)$$

It should be appreciated that if the audio data has 16-bits accuracy, then both the hs and the "d" need $2^{-16}$ accuracy. For a hardware implementation, as shown in FIG. 4, the hs values (i.e., impulse response values) can be stored in filter coefficient table 402. If filter coefficient table 402 stores all the hs values with 16-bits accuracy for any ratio band-limited sampler, table 402 is very large. Normally, the table requires $2^{16}*16$ bits. Even with some table interpolation, the table size still can be $2^8*16$ bits. But the present invention only needs to resample data at 1.5×, 2× and 3× because of the use of 2-stage interpolation, thereby significantly reducing the size required for table 402. Thus, a 48×16 bits' table may be utilized with the embodiments described herein.

As shown in FIG. 4, multiplier 404 and adder 406 of multiplier accumulator 302 can be additionally used for linear interpolation during the second stage sampling at 44.1 KHz. MAC 302 includes register 407 for the temporary storage of data being accumulated. In one embodiment, register 407 is a 34-bit register. As mentioned above, multiplier accumulator 302 can include common circuitry for sampling the audio data at 48 KHz in the first stage and sampling the audio data at 44.1 KHz in the second stage to reduce the footprint of the circuitry. Samples Counter Controller 405 controls the data read from Filter Coefficient table 402 and PCM Data buffer 403. Samples Counter Controller 405 counts up by Fs/Fs' at the output rate–Fs'. For example, if the input rate is Fs=32 KHz, then the output rate is 48 KHz. The counter will count up $^{32}/_{48}=^2/_3$ at the 48 KHz rate. That is, the counter sequence would be: 0, 0.667, 1.333, 2, 2.667, 3.333, 4, etc. The integer part of the counter is N, and the fraction part is d. The N is used to index the original PCM data. The d is used to index the coefficient table 402. MAC 302 takes the original PCM data indexed by N and the filter coefficient indexed by d to calculate the output PCM data.

Figure 5:
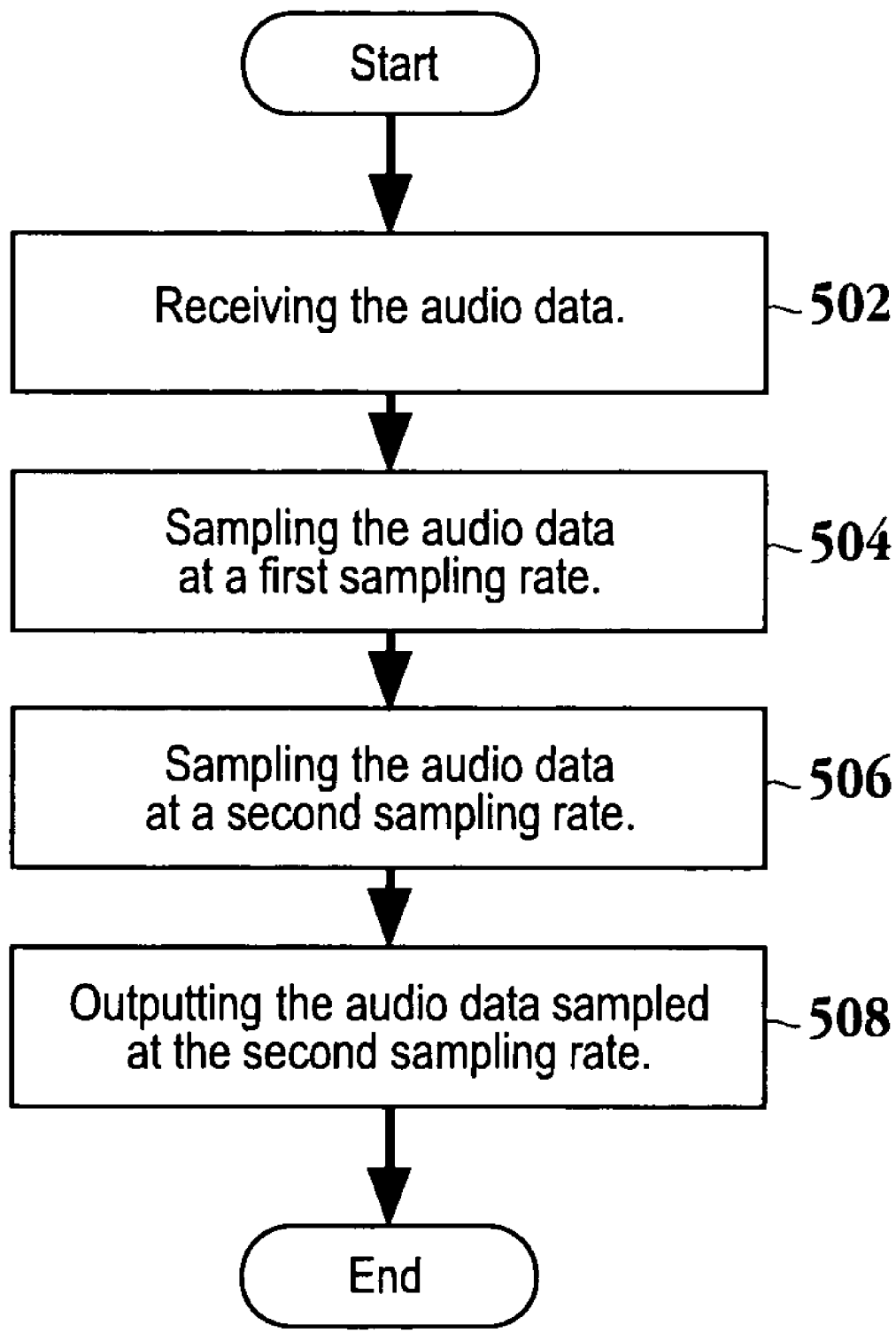
FIG. 5 is a flowchart diagram illustrating a high level overview of the method operations for sampling audio data, in accordance with one embodiment of the present invention.

FIG. 5 is a flowchart diagram illustrating a high level overview of the method operations for sampling audio data, in accordance with one embodiment of the present invention. Starting in operation 502, the resampling circuit first receives the audio data. As discussed above, the audio data received by resampling circuit can be sampled at different bit rates, such as 44.1 KHz, 22.05 KHz, 16 KHz, 24 KHz, 32 KHz, 48 KHz, etc. If the sampling rate is an integer multiple of a sampling rate outputted by a resampling circuit, then resampling circuit samples the audio data directly at the output sampling rate (e.g., 44.1 KHz). Otherwise, as shown in operations 504 and 506, the audio data first is sampled at a first sampling rate (e.g., 48 KHz) using a first interpolation calculation (e.g., band-limited interpolation). It should be appreciated that if the audio data initially has a sampling rate that is equal to the first sampling rate, then sampling operation 504 is bypassed. A mentioned above, the incoming sampling rate may be determined through header information specifying this rate, wherein the header information is appended to the incoming data. After the audio data is sampled at the first sampling rate, the audio data is again sampled at a second sampling rate (e.g., 44.1 KHz) using a second interpolation calculation (e.g., linear interpolation), that is different from the first interpolation calculation. In one embodiment, when compared to the first interpolation calculation, a simpler and faster form of interpolation, such as linear interpolation, may be used in the second sampling calculation especially when the difference between the first sampling rate and the second sampling rate is small. In another embodiment, the difference between the first and second sampling rate is about 10%. After the audio data is sampled at the second sampling rate, the audio data is outputted to a digital-to-analog converter in operation 508.

In summary, the above-described invention provides methods, circuitries, and systems for sampling audio data. Essentially, in one embodiment, the audio data is sampled at 48 KHz and then at 44.1 KHz using two different interpolation calculations (e.g., band-limited interpolation and linear interpolation). By combining two different sampling methods, the disadvantages of each method are mitigated while the advantages are maintained. For example, the use of linear interpolation provides a faster sampling rate when compared to the use of just the band-limited interpolation. By also utilizing band-limited interpolation for certain audio data, the quality of outputted audio is not sacrificed. Further, by combining the linear interpolation circuitry with the band-limited interpolation circuitry, the logic circuit has a smaller footprint than having two separate logic circuitries for linear interpolation and for band-limited interpolation. In one embodiment, the multiplier accumulator circuitry is shared between the first and second stages.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The above described invention may be practiced with other computer system configurations including hand-held devices, microprocessor systems, microprocessor-based or programmable consumer electronics, minicomputers, mainframe computers and the like. Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

The invention claimed is:

1. A method for sampling audio data, comprising method operations of:
   receiving the audio data, the audio data having a sampling rate that is less than 48 kilohertz;
   sampling the audio data at about 48 kilohertz, the audio data being sampled at about 48 kilohertz defining a first sampled audio data;
   sampling the first sampled audio data at about 44.1 kilohertz, the first sampled audio data being sampled at about 44.1 kilohertz defining a second sampled audio data; and
   outputting the second sampled audio data.

2. The method of claim 1, wherein the method operation of sampling the audio data at about 48 kilohertz utilizes a different sampling method than the method operation of sampling the first sampled audio data at about 44.1 kilohertz.

3. The method of claim 1, wherein the method operation of sampling the audio data at about 48 kilohertz is calculated by band-limited interpolation.

4. The method of claim 1, wherein the method operation of sampling the first sampled audio data at about 44.1 kilohertz is calculated by linear interpolation.

5. The method of claim 1, wherein the method operation of receiving the audio data includes,
   determining a sampling rate of the audio data from header information appended to the audio data.

6. The method of claim 1, further comprising:
   sharing common circuitry for the method operation of sampling the audio data at about 48 kilohertz and the method operation of sampling the first sampled audio data at about 44.1 kilohertz.

7. The method of claim 1, wherein the common circuitry is a multiplier accumulator.

8. A system for sampling audio data, comprising:
   an audio decoder;
   a resampling circuit in communication with the audio decoder, the resampling circuit including,
   circuitry configured for up sampling the audio data at a first frequency and then down sampling the up sampled audio data at a second frequency; and
   a digital-to-analog converter in communication with the resampling circuit; and
   wherein the circuitry configured for sampling the audio data at the first frequency and the second frequency includes,
   a filter coefficient table configured to store impulse response values for band-limited interpolation;
   a multiplier in communication with the filter coefficient table;
   an adder in communication with the multiplier; and
   a register for temporarily storing a value being accumulated; and
   wherein the multiplier, the adder and the register are configured to perform linear interpolation.

9. A system for sampling audio data, comprising:
   an audio decoder;
   a resampling circuit in communication with the audio decoder, the resampling circuit including,
   circuitry configured for up sampling the audio data at a first frequency and then down sampling the up sampled audio data at a second frequency; and
   a digital-to-analog converter in communication with the resampling circuit; and
   wherein the first frequency is about 48 kilohertz and the second frequency is about 44.1 kilohertz.

10. A resampling circuit for sampling audio data, comprising:
    a multiplier accumulator configured to sample the audio data at a first stage at a first frequency and sample first stage output data at a second frequency, the first frequency being greater than the second frequency;
    a memory in communication with the multiplier accumulator; and
    selection circuitry in communication with the memory and the multiplier accumulator, the selection circuitry being configured to select the audio data sampled at the second frequency for output to a digital-to-analog converter.

11. The resampling circuit of claim 10, wherein the multiplier accumulator includes,
    a filter coefficient table configured to store impulse response values for band-limited interpolation;

a multiplier in communication with the filter coefficient table;

an adder in communication with the multiplier; and a register for temporarily storing a value being accumulated.

12. The resampling circuit of claim 10, wherein the multiplier accumulator receives the audio data from an audio decoder, the audio decoder providing a select signal to the selection circuitry in order to select the audio data for output.

13. The resampling circuit of claim 10, wherein the multiplier accumulator is configured for assisting in sampling by both band-limited interpolation and linear interpolation.

14. The resampling circuit of claim 10, wherein the first frequency and the second frequency are within about 10 percent of each other.

* * * * *